United States Patent
Huang et al.

(10) Patent No.: US 12,432,887 B2
(45) Date of Patent: Sep. 30, 2025

(54) SERVER, CABINET SERVER, AND BLADE SERVER

(71) Applicant: Huawei Technologies Co., Ltd., Shenzhen (CN)

(72) Inventors: Cheng Huang, Shenzhen (CN); Yimin Yao, Shenzhen (CN); Yiwei Fan, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 194 days.

(21) Appl. No.: 18/157,559

(22) Filed: Jan. 20, 2023

(65) Prior Publication Data

US 2023/0156972 A1   May 18, 2023

Related U.S. Application Data

(63) Continuation of application No. PCT/CN2021/093974, filed on May 15, 2021.

(30) Foreign Application Priority Data

Jul. 28, 2020   (CN) .......................... 202010739036.7
Sep. 18, 2020   (CN) .......................... 202010986329.5

(51) Int. Cl.
*H05K 7/20* (2006.01)
*G06F 1/18* (2006.01)
*G06F 1/20* (2006.01)
*H05K 7/14* (2006.01)

(52) U.S. Cl.
CPC ......... *H05K 7/20709* (2013.01); *G06F 1/184* (2013.01); *G06F 1/187* (2013.01); *G06F 1/206* (2013.01); *H05K 7/1489* (2013.01)

(58) Field of Classification Search
CPC ............. H05K 7/20709; H05K 7/1489; H05K 7/1487; H05K 7/20727; G06F 1/184; G06F 1/187; G06F 1/206; G06F 1/183; G06F 1/185
See application file for complete search history.

(56) References Cited

U.S. PATENT DOCUMENTS

| | | | | |
|---|---|---|---|---|
| 6,129,598 A | * | 10/2000 | Yu ........................... | G06F 1/189 439/907 |
| 6,289,043 B1 | * | 9/2001 | Kumata .............. | G06F 13/4068 375/220 |
| 10,398,060 B1 | | 8/2019 | Beall et al. | |
| 2004/0257763 A1 | | 12/2004 | Andresen et al. | |
| 2005/0153577 A1 | * | 7/2005 | Shen .................. | H01R 12/7082 439/61 |

(Continued)

FOREIGN PATENT DOCUMENTS

| | | |
|---|---|---|
| CN | 102207751 A | 10/2011 |
| CN | 103034302 A | 4/2013 |

(Continued)

*Primary Examiner* — Jacob R Crum
(74) *Attorney, Agent, or Firm* — Conley Rose, P.C.

(57) ABSTRACT

A server includes a backplane, and a hard disk in the server may be housed on the backplane. The backplane is disposed between an air exhaust vent and an air intake vent of the server, and the backplane may be parallel to an air inflow direction of the air intake vent or an air outflow direction of the air exhaust vent. The backplane is parallel to the air direction.

20 Claims, 15 Drawing Sheets

(56) References Cited

U.S. PATENT DOCUMENTS

| | | |
|---|---|---|
| 2006/0194460 A1 | 8/2006 | Chen et al. |
| 2007/0091559 A1 | 4/2007 | Malone |
| 2009/0103414 A1 | 4/2009 | Joshi et al. |
| 2011/0235262 A1 | 9/2011 | Cheng |
| 2011/0279964 A1* | 11/2011 | Zhang ................ G11B 33/142 |
| | | 361/679.33 |
| 2013/0077223 A1 | 3/2013 | Xu |
| 2015/0181768 A1* | 6/2015 | Chen ..................... H05K 7/20 |
| | | 361/679.46 |
| 2015/0305194 A1* | 10/2015 | Xiang ............... H05K 7/20136 |
| | | 361/695 |
| 2021/0287720 A1 | 9/2021 | Wang et al. |

FOREIGN PATENT DOCUMENTS

| | | |
|---|---|---|
| CN | 103701665 A | 4/2014 |
| CN | 111289922 A | 6/2020 |
| TW | 202010377 A | 3/2020 |
| WO | 2020114021 A1 | 6/2020 |

\* cited by examiner

SERVER, CABINET SERVER, AND BLADE SERVER

CROSS-REFERENCE TO RELATED APPLICATIONS

This is a continuation of Int'l Patent App. No. PCT/CN2021/093974 filed on May 15, 2021, which claims priority to Chinese Patent App. No. 202010986329.5 filed on Sep. 18, 2020 and Chinese Patent App. No. 202010739036.7 filed on Jul. 28, 2020, all of which are incorporated by reference.

FIELD

This disclosure relates to the field of server technologies, and in particular, to a server, a cabinet server, and a blade server.

BACKGROUND

With improvement of a computing capability of a server, accordingly, power consumption of each component (for example, a processor, a memory, or a hard disk) in the server significantly increases. As the power consumption of the component in the server increases, more heat is accumulated on the component in the server. To ensure that each component in the server normally operates, a heat dissipation capability of the server needs to be improved to dissipate, in a timely manner, the heat accumulated on the component in the server.

Currently, air cooling is usually used in the server for heat dissipation, and an air exhaust vent and an air intake vent are disposed in the server. Cold air flows into through the air intake vent, passes through each component in the server, takes away the heat accumulated on each component in the server, and then flows out through the air exhaust vent.

However, because a direction in which a backplane configured to house the hard disk is disposed in the server is perpendicular to an air direction of the air intake vent, the hard disk backplane blocks circulation of the cold air. This reduces the heat dissipation capability of the entire server. Although an air volume of the circulating cold air can be increased by drilling holes on the hard disk backplane, the backplane is designed with a complex circuit, and a drilling area is limited. Consequently, this still cannot ensure that the server has a relatively good heat dissipation capability.

SUMMARY

This disclosure provides a server, a cabinet server, and a blade server, to improve a heat dissipation capability of the server.

According to a first aspect, an embodiment provides a server. The server includes a backplane. A component, for example, a hard disk or a memory, in the server may be housed on the backplane. The backplane may be disposed between an air exhaust vent and an air intake vent of the server, and the backplane may be parallel to an air inflow direction of the air intake vent or an air outflow direction of the air exhaust vent.

Based on the server, the backplane is parallel to the air direction, to reduce obstruction to air flowing into or flowing out of the server, increase a ventilation volume in the server, and improve a heat dissipation capability of the server.

In a possible design, the hard disk in the server may be housed on the backplane, and the hard disk in the server may be housed on the backplane in a direction parallel to the backplane.

Based on the server, the hard disk is also parallel to the air direction, to further reduce the obstruction to the air flowing into or out of the server, and ensure that the server has a relatively good heat dissipation capability.

In a possible design, the backplane includes a plurality of PCBs. The plurality of PCBs are disposed in parallel. To be specific, each PCB is parallel to an air inflow or outflow direction of the server. Each PCB is provided with a hard disk slot, and the hard disk in the server may be housed on each hard disk slot.

Based on the server, the backplane uses a layered structure, to ensure that sufficient hard disks can further be housed on the backplane when the ventilation volume in the server is ensured.

In a possible design, there are many manners of arranging the plurality of PCBs. For example, the plurality of PCBs may be located on a same plane, and the plane is parallel to the air inflow direction of the air intake vent or the air outflow direction of the air exhaust vent.

Based on the server, the plurality of PCBs may be arranged on the same plane, so that a large volume of air may circulate in the server, to ensure the heat dissipation capability of the server.

In a possible design, the plurality of PCBs may alternatively be distributed on a plurality of planes, and the plurality of planes are all parallel to the air inflow direction of the air intake vent or the air outflow direction of the air exhaust vent. For example, the plurality of PCBs may be sequentially arranged in a direction perpendicular to the air direction. To be specific, projections of the plurality of PCBs on a plane perpendicular to the air direction coincide. The plurality of PCBs may alternatively be arranged in a stepped shape.

Based on the server, arrangement manners of the plurality of PCBs are flexible, and are applicable to different server architectures.

In a possible design, there is a spacing between adjacent PCBs in the plurality of PCBs in the direction perpendicular to the air inflow direction of the air intake vent or the air outflow direction of the air exhaust vent.

Based on the server, there is a spacing between the adjacent PCBs, and the air flowing into the server can circulate through the spacing, so that heat accumulated on the component in the server can be taken away, to achieve a better heat dissipation effect.

In a possible design, each of the plurality of PCBs is fastened to a housing of the server by using a mechanical part.

Based on the server, the plurality of PCBs are fastened to the housing of the server, to ensure stability of the plurality of PCBs.

In a possible design, the server may further include a mainboard. The backplane includes a plurality of first interfaces, the mainboard includes a plurality of second interfaces, and one first interface corresponds to one second interface. Each first interface is connected to a corresponding second interface through a data cable, and lengths of data cables used for connecting adjacent first interfaces to corresponding second interfaces are different. A correspondence between the first interfaces and the second interfaces may be preconfigured.

Based on the server, the lengths of the data cables used for connecting the adjacent first interfaces to the corresponding second interfaces are different. Therefore, the corresponding first interface and second interface can be distinguished by using the length of the data cable, to ensure that the first interface can be correctly connected to the second interface.

In a possible design, the server may further include an expansion board. The expansion board may be parallel to the air inflow direction of the air intake vent or the air outflow direction of the air exhaust vent.

The first interface may be connected to the second interface through the data cable by using the expansion board. In other words, the first interface may be connected to the expansion board through the data cable, and the expansion board is connected to the second interface.

Based on the server, the expansion board can implement an interface expansion effect, so that each first interface on the backplane can be connected to the mainboard of the server.

In a possible design, the server may further include a management module. The management module is connected to the second interface, and the management module may detect whether the first interface is correctly connected to the second interface, and may give an alarm when detecting that first interface is incorrectly connected to the second interface. The first interface being correctly connected to the second interface means that the first interface is connected to the corresponding second interface. Correspondingly, the first interface being incorrectly connected to the second interface means that the first interface is not connected to the corresponding second interface, for example, is connected to another second interface, or the data cable between the first interface and the corresponding second interface is disconnected.

Based on the server, the management module can find, in a timely manner, that the first interface is incorrectly connected to the second interface, to further determine that the first interface may be connected to the corresponding second interface.

In a possible design, when detecting whether the first interface is correctly connected to the second interface, the management module may obtain a signal on the data cable between the first interface and the second interface, and determine, based on the signal on the data cable, whether the first interface is correctly connected to the second interface. For example, the management module may compare the signal on the data cable with a preset signal. If the signals are consistent, it indicates that the first interface is correctly connected to the second interface. Otherwise, the first interface is incorrectly connected to the second interface.

Based on the server, the management module can accurately determine, by using the signal on the data cable, whether the first interface is correctly connected to the second interface, and can also find, in a relatively timely manner by using the signal on the data cable, that the first interface is incorrectly connected to the second interface, to ensure detection timeliness.

According to a second aspect, an embodiment provides a cabinet server. The cabinet server includes one or more servers provided in any one of the first aspect or the designs of the first aspect.

According to a third aspect, an embodiment provides a blade server. The blade server includes one or more servers provided in any one of the first aspect or the designs of the first aspect.

DETAILED DESCRIPTION

Figure 1A:
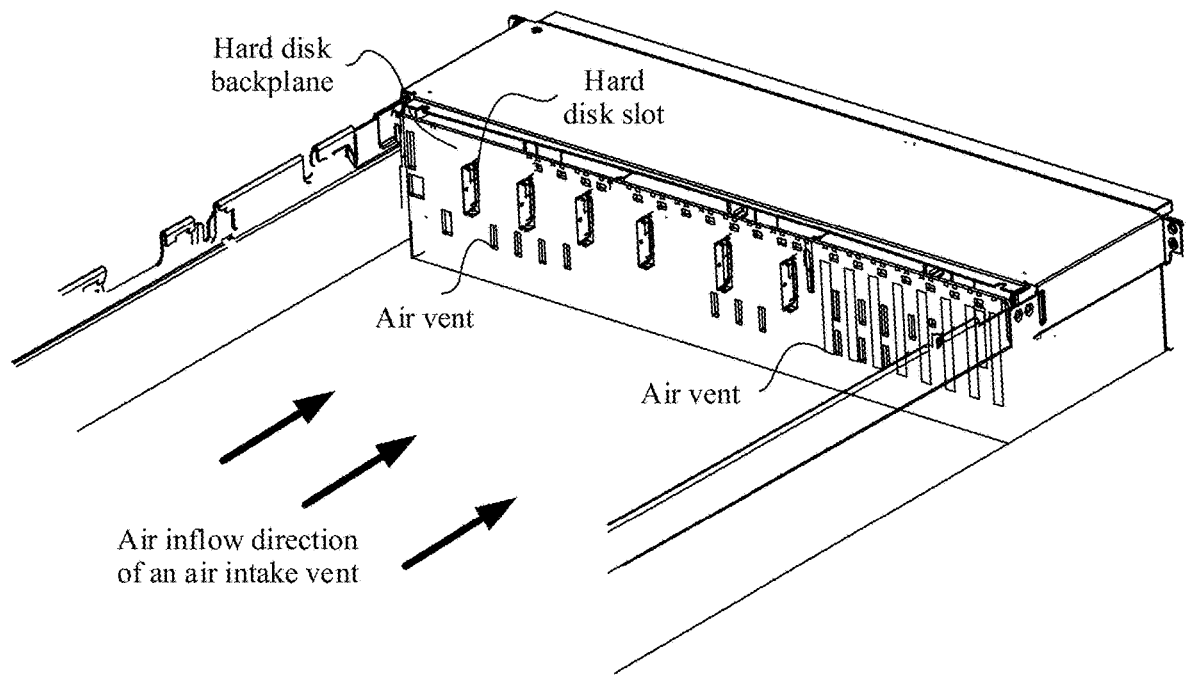
FIG. 1A is a schematic diagram of a disposed position of a hard disk backplane in a server.

FIG. 1A is a schematic diagram of a disposed position of a hard disk backplane in a server. The hard disk backplane is located between an air exhaust vent and an air intake vent of the server. In FIG. 1A, the hard disk backplane is vertically housed in the server, and the hard disk backplane is perpendicular to an air direction of the air exhaust vent of the server. This disposing manner of the hard disk backplane blocks air circulation in the server.

Figure 1B:
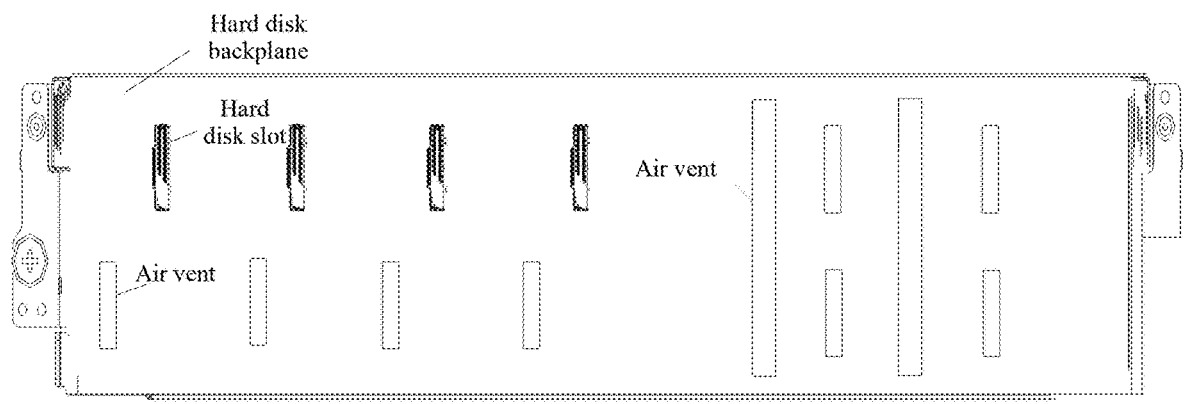
FIG. 1B is a schematic diagram of a structure of a hard disk backplane in a server.

As shown in FIG. 1B, in addition to hard disk slots, the hard disk backplane may further be provided with air vents. However, because the hard disk backplane is a printed circuit board (PCB), a large quantity of components need to be deployed on the PCB. Consequently, positions for disposing the air vents on the hard disk backplane are limited, only few air vents can be disposed on the hard disk backplane, and the few air vents cannot effectively improve a heat dissipation capability of the server.

Figure 2A:
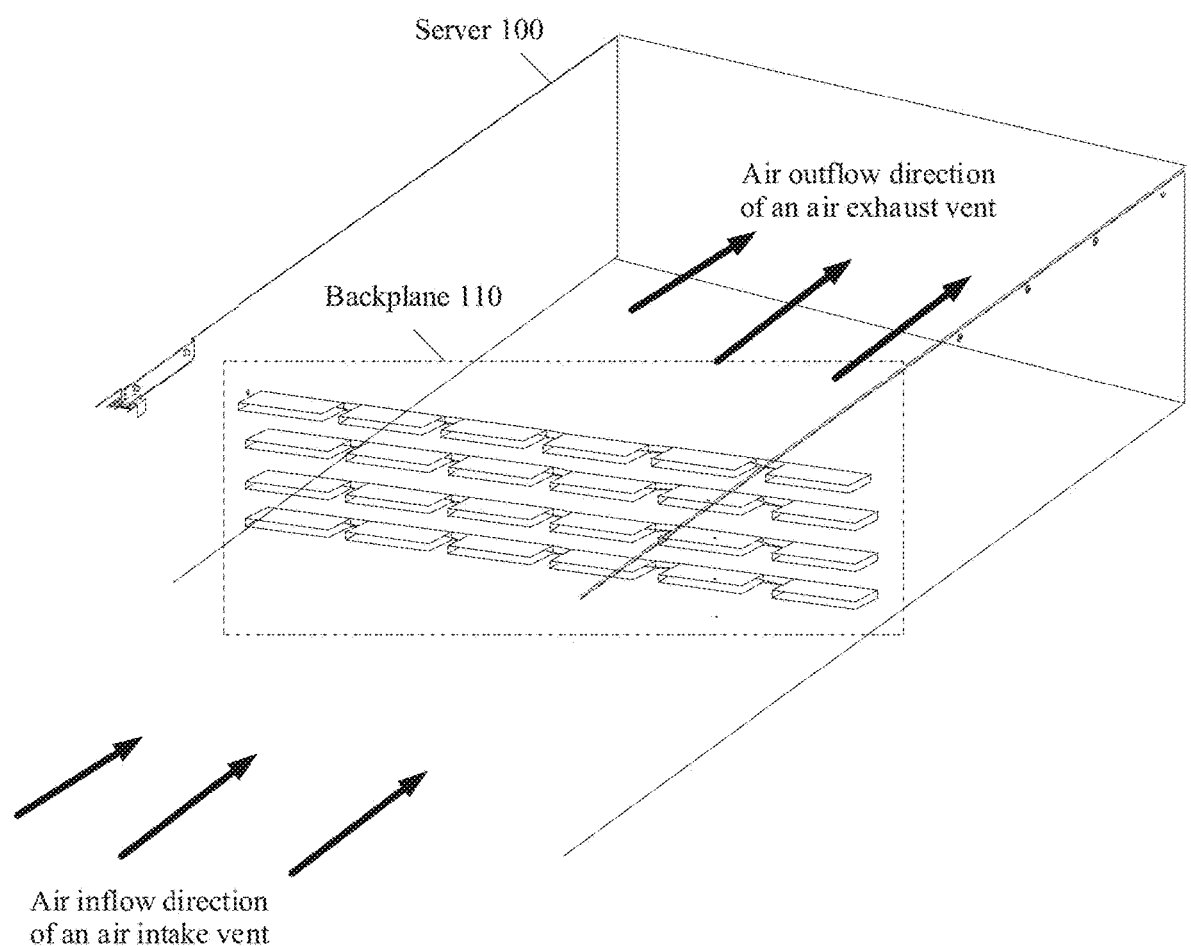
FIG. 2A is a schematic diagram of a structure of a server.

To improve the heat dissipation capability of the server, an embodiment provides a server. FIG. 2A is a schematic diagram of the server according to this embodiment. A server 100 includes a backplane 110, and the backplane 110 is configured to house a component in the server 100. A type of the component is not limited in this embodiment. For example, the component may be a hard disk or a memory.

The backplane 110 is located between an air exhaust vent and an air intake vent, and the backplane 110 may be parallel to an air inflow direction of the air intake vent or an air outflow direction of the air exhaust vent.

In this embodiment, an example in which the air inflow direction of the air intake vent is consistent with the air outflow direction of the air exhaust vent is used for description. For a case in which the air inflow direction of the air intake vent is inconsistent with the air outflow direction of the air exhaust vent, the backplane 110 may be parallel to either of the air inflow direction of the air intake vent and the air outflow direction of the air exhaust vent.

With respect to a relationship between the backplane 110, the air inflow direction of the air intake vent, and the air outflow direction of the air exhaust vent, the backplane 110 may be abstracted as a spatial plane (where the spatial plane may be referred to as a spatial plane corresponding to the backplane 110), the air inflow direction of the air intake vent (or the air outflow direction of the air exhaust vent) may be abstracted as a group of spatial straight lines (where the group of spatial straight lines may be referred to as spatial straight lines corresponding to the air inflow direction of the air intake vent or spatial straight lines corresponding to the air outflow direction of the air exhaust vent).

The backplane 110 being parallel to the air inflow direction of the air intake vent means that the spatial plane corresponding to the backplane 110 is parallel to the spatial straight lines corresponding to the air inflow direction of the air intake vent. The backplane 110 being parallel to the air outflow direction of the air exhaust vent means that the spatial plane corresponding to the backplane 110 is parallel to the spatial straight lines corresponding to the air outflow direction of the air exhaust vent.

When the backplane 110 is disposed at a different position in the server 100, a structure of the server 100 differs to an extent. Directions of two mutually perpendicular edges of the server 100 are respectively defined as a width direction and a length direction herein. The length direction is a direction of an edge between a front side and a rear side of the server 100, and the width direction is a direction of an edge between a left side and a right side of the server 100.

In the server 100 shown in FIG. 2A, the backplane 110 is disposed in the width direction of the server 100. To be specific, two ends of the backplane 110 may be respectively fastened to the left side and the right side of the server 100. The backplane 110 is parallel to the air inflow direction of the air intake vent.

Figure 2B:
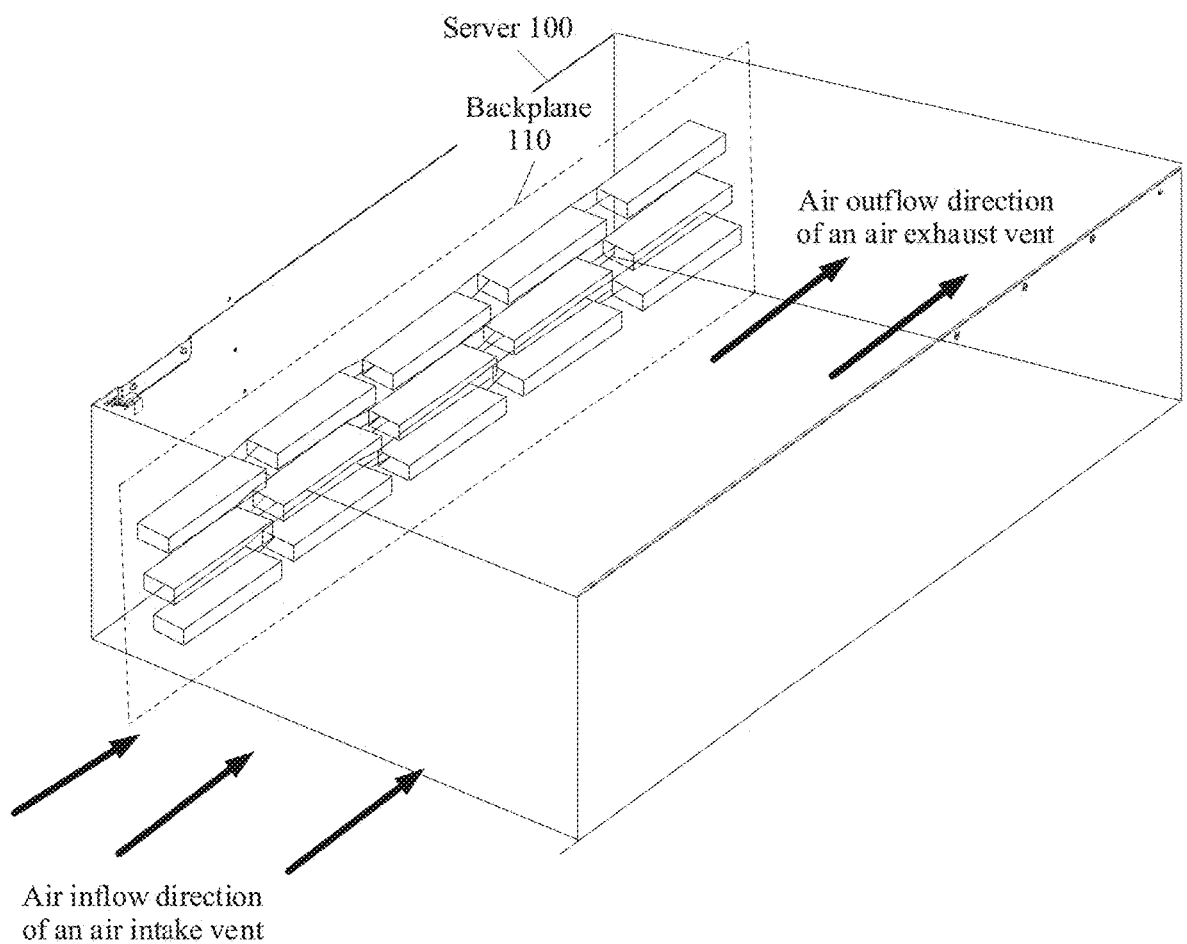
FIG. 2B is a schematic diagram of a structure of a server.

FIG. 2B shows another server 100 according to an embodiment. A backplane 110 in the server 100 is disposed in a length direction of the server 100. In other words, two ends of the backplane 110 may be respectively fastened to a front side and a rear side of the server 100. The backplane 110 is parallel to an air inflow direction of an air intake vent.

The backplane 110 is disposed in a direction parallel to an air direction (for example, the air inflow direction of the air intake vent or an air outflow direction of an air exhaust vent), so that the backplane 110 can greatly reduce obstruction to air flowing into the server 100, and a ventilation volume in the server 100 can be effectively improved, to further improve a heat dissipation capability of the server 100.

For example, the backplane 110 is a hard disk backplane, that is, is configured to house a hard disk in the server 100. A case in which the backplane 110 is configured to house another component in the server 100 is similar to the case in which the backplane 110 is a hard disk backplane, and a difference lies in that a housed component is different. For a structure and a disposing manner of the backplane 110, refer to related descriptions when the backplane 110 is a hard disk backplane. Details are not described herein again.

When the hard disk is housed on the backplane 110, the hard disk may be housed on the backplane 110 in a direction parallel to the backplane 110, so that the hard disk is also parallel to the air inflow direction of the air intake vent. The hard disk housed on the backplane 110 also does not greatly obstruct the air flowing into the server 100, to further ensure the ventilation volume of the server 100.

The following describes the structure of the backplane 110.

The backplane 110 may include one or more PCBs 111. One PCB 111 may be provided with one or more hard disk slots 112, and a hard disk can be inserted into the hard disk slot 112. For a direction in which the hard disk is housed, refer to the foregoing descriptions. Details are not described herein again.

When the backplane 110 includes a plurality of PCBs 111, the plurality of PCBs 111 are disposed in parallel, and there is a plurality of manners in which the plurality of PCBs 111 are disposed in parallel. For example, the plurality of PCBs 111 may be located on a same plane, or may be separately located on a plurality of different parallel planes. The following lists several of the plurality of manners.

Figure 3A:
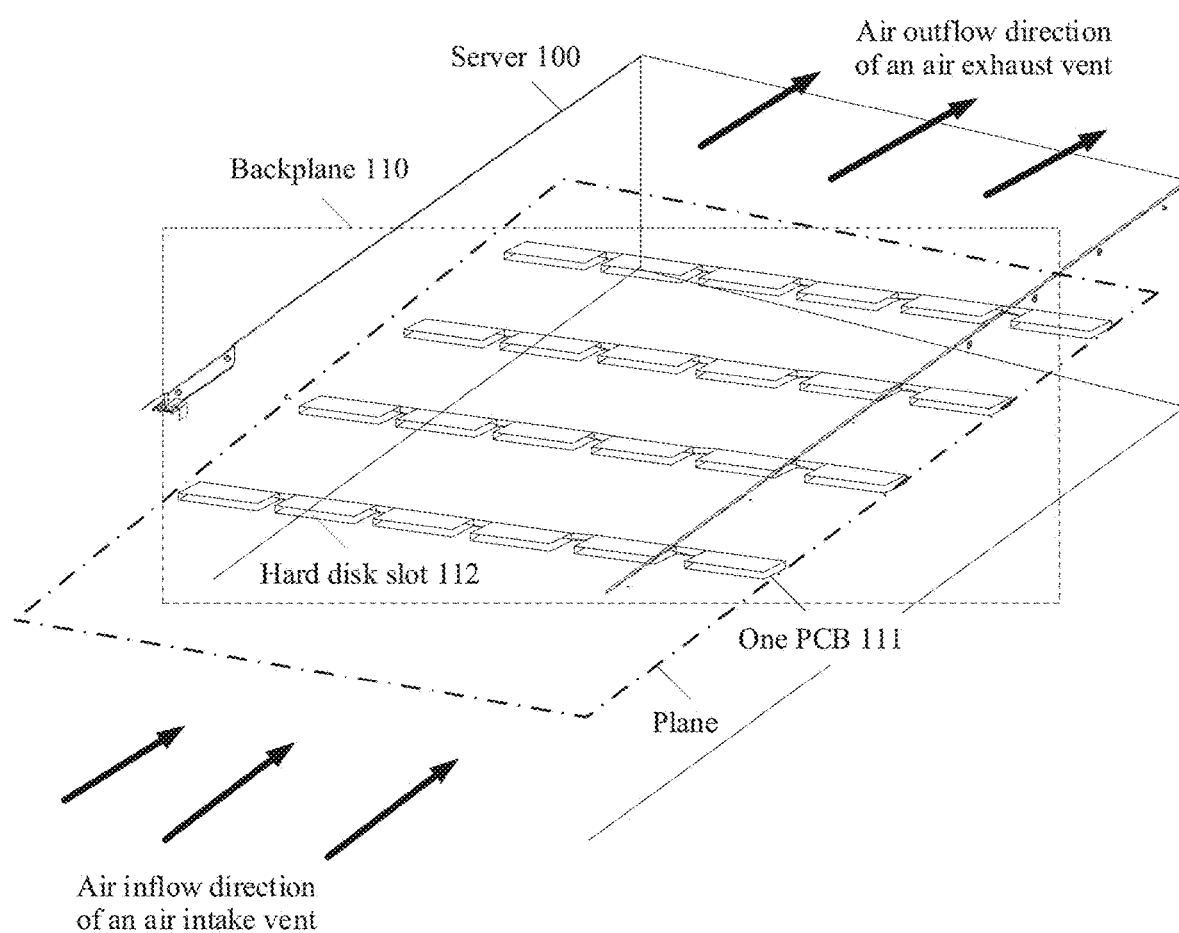
FIG. 3A to FIG. 3C are schematic diagrams of a structure of a plurality of PCBs.

FIG. 3A is a schematic diagram of a structure of a server 100 according to an embodiment. A backplane 110 includes a plurality of PCBs 111, the plurality of PCBs 111 are located on a same plane, and the plane is parallel to an air inflow direction of an air intake vent.

It can be learned from FIG. 3A that the plurality of PCBs 111 in the backplane 110 are disposed side by side in a direction parallel to the air inflow direction of the air intake vent.

There may be a spacing between the plurality of PCBs 111, and the plurality of PCBs 111 are arranged relatively loosely. Alternatively, there may be no spacing, and the plurality of PCBs 111 may be closely arranged.

In this manner, the plurality of PCBs 111 are located on the same plane, and obstruction of the backplane 110 to air flowing into the server 100 is greatly reduced, so that a volume of air circulating in the entire server 100 is increased, to improve a heat dissipation capability of the server 100.

Figure 3B:
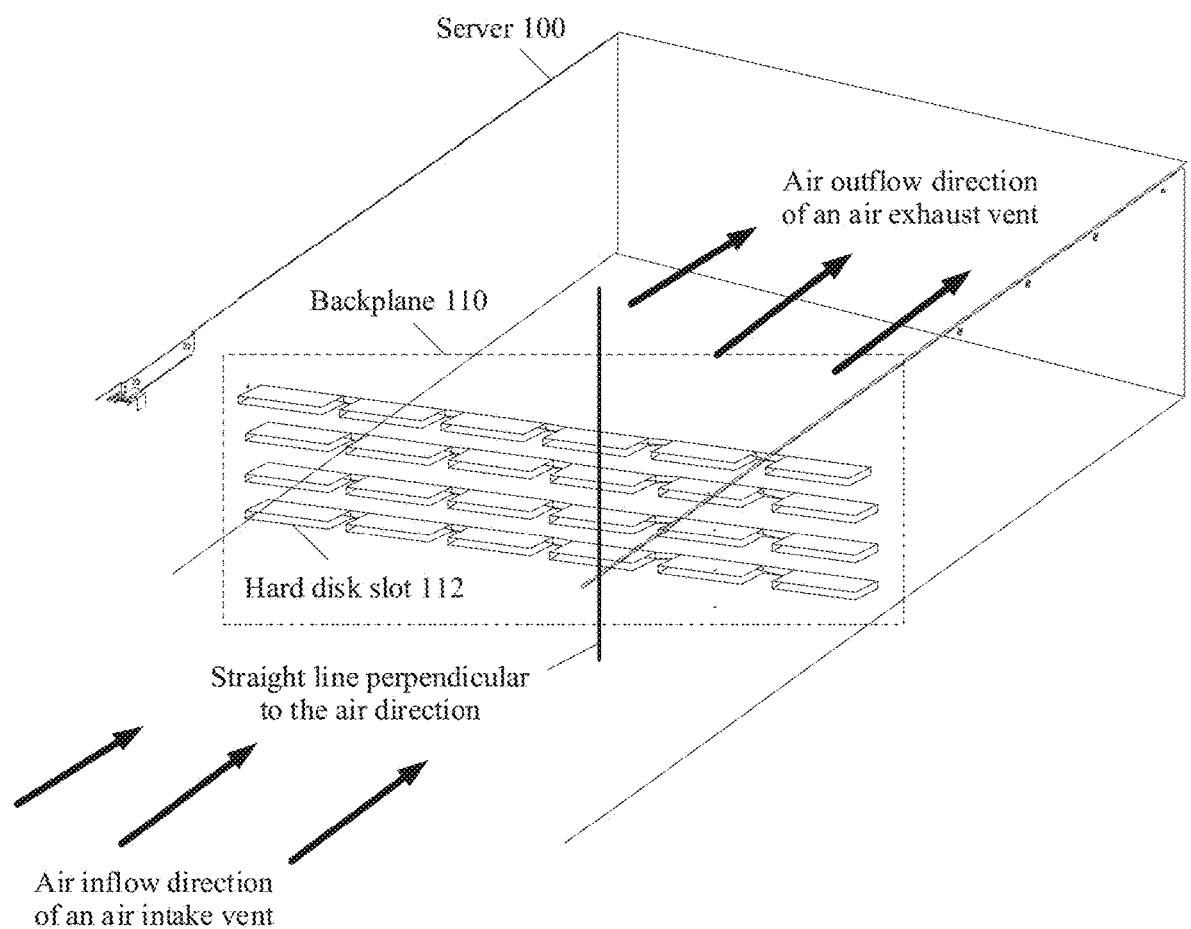

FIG. 3B is a schematic diagram of a structure of a server 100 according to an embodiment. A backplane 110 includes a plurality of PCBs 111, the plurality of PCBs 111 are located on a plurality of different parallel planes, and the plurality of parallel planes are parallel to an air inflow direction of an air intake vent. In other words, there are PCBs 111 located on different planes in the plurality of PCBs 111.

A quantity of the plurality of planes is not limited herein. The quantity of the plurality of parallel planes may be the same as a quantity of the plurality of PCBs 111. In other words, one PCB 111 is located on one plane.

The plurality of PCBs 111 may be arranged in the following two manners.

Manner 1: The plurality of PCBs 111 intersect with a same straight line, and are all perpendicular to the straight line, and the straight line is perpendicular to the air inflow direction of the air intake vent. In other words, the plurality of PCBs 111 are aligned in a direction perpendicular to the air inflow direction of the air intake vent, and projections of the plurality of PCBs 111 on a plane perpendicular to the air inflow direction of the air intake vent coincide. The backplane 110 shown in FIG. 3B is arranged in Manner 1.

To further improve a heat dissipation capability of the server 100, there is a spacing between adjacent PCBs 111 in the plurality of PCBs 111 in the direction perpendicular to the air inflow direction of the air intake vent. In this way, air flowing into the server 100 can circulate through the spacings, to improve a ventilation rate of the server 100.

In this manner, the plurality of PCBs 111 are disposed in the server 100 in a centralized manner, to occupy less space. In addition, because the plurality of PCBs 111 are parallel to the air inflow direction of the air intake vent, obstruction to the air can be reduced, and heat dissipation of the server 100 is ensured.

Manner 2: The plurality of PCBs 111 are sequentially arranged in a direction parallel to the air inflow direction of the air intake vent, and the plurality of PCBs 111 are arranged in a stepped shape.

Figure 3C:
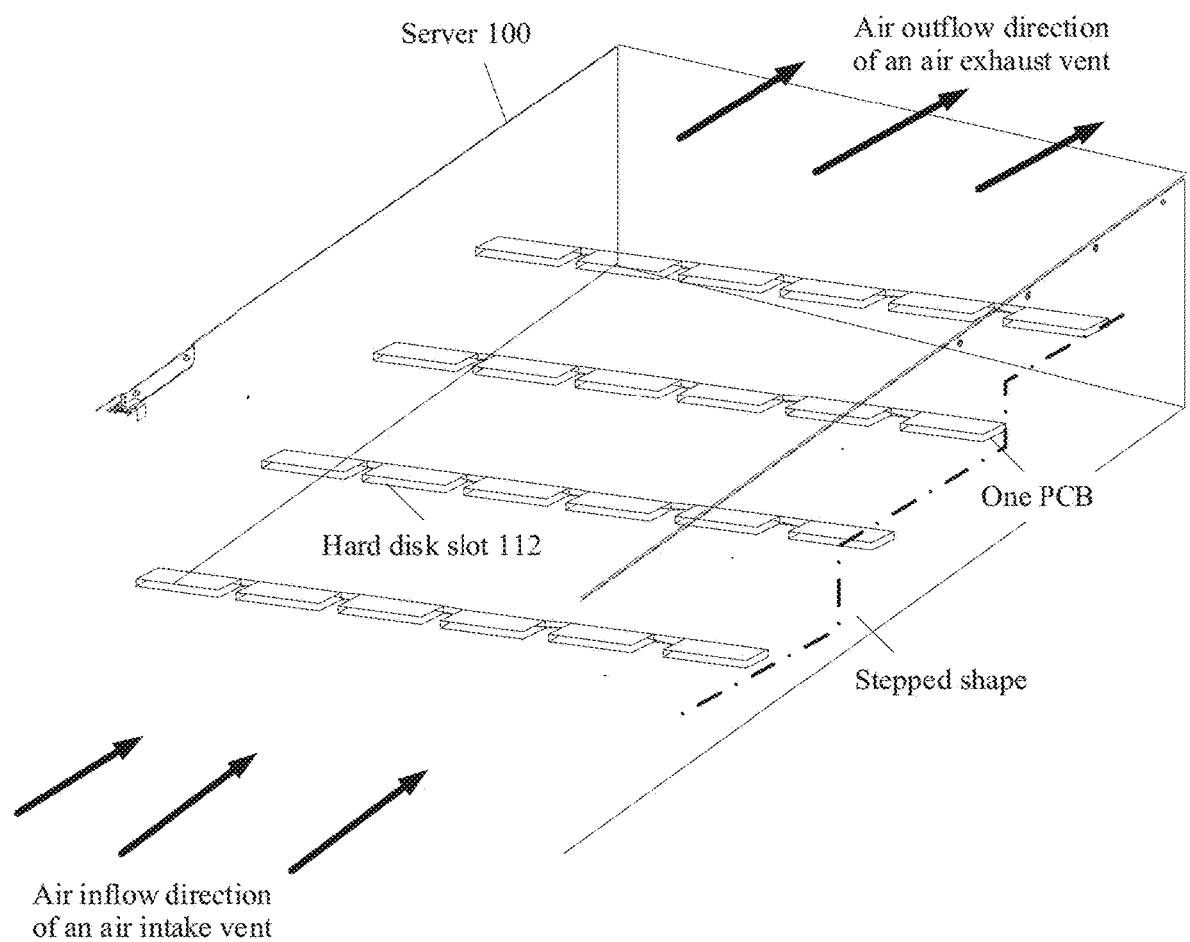

A backplane 110 shown in FIG. 3C is arranged in Manner 2. Similar to that in Manner 1, there may also be a spacing between adjacent PCBs 111 in the plurality of PCBs 111 in a direction perpendicular to the air inflow direction of the air intake vent, to improve a ventilation rate of the server 100.

In this manner, the plurality of PCBs 111 are dispersedly disposed in the server 100, and this is applicable to a scenario in which components in the server 100 are specially deployed. In addition, because the plurality of PCBs 111 are parallel to the air inflow direction of the air intake vent, it can still be ensured that the server 100 has a better heat dissipation capability.

The quantity of the plurality of planes may alternatively be different from the quantity of the plurality of PCBs 111. For example, the quantity of the plurality of planes may be less than the quantity of the plurality of PCBs 111. In other words, at least two of the plurality of PCBs 111 are located on a same plane. In this case, PCBs 111 located on a same plane may be arranged in the manner shown in FIG. 3A, and PCBs 111 located on different planes may be arranged in the manner shown in FIG. 3B or FIG. 3C. For a specific arrangement manner, refer to the foregoing content. Details are not described herein again.

The plurality of PCBs 111 may be fastened in the server 100, and there are many manners of fastening the plurality of PCBs 111 in the server 100. For example, the plurality of PCBs 111 may be fastened to a housing of the server 100, and the plurality of PCBs 111 may alternatively be connected to a component having a specific fastening function in the server 100.

Figure 4A:
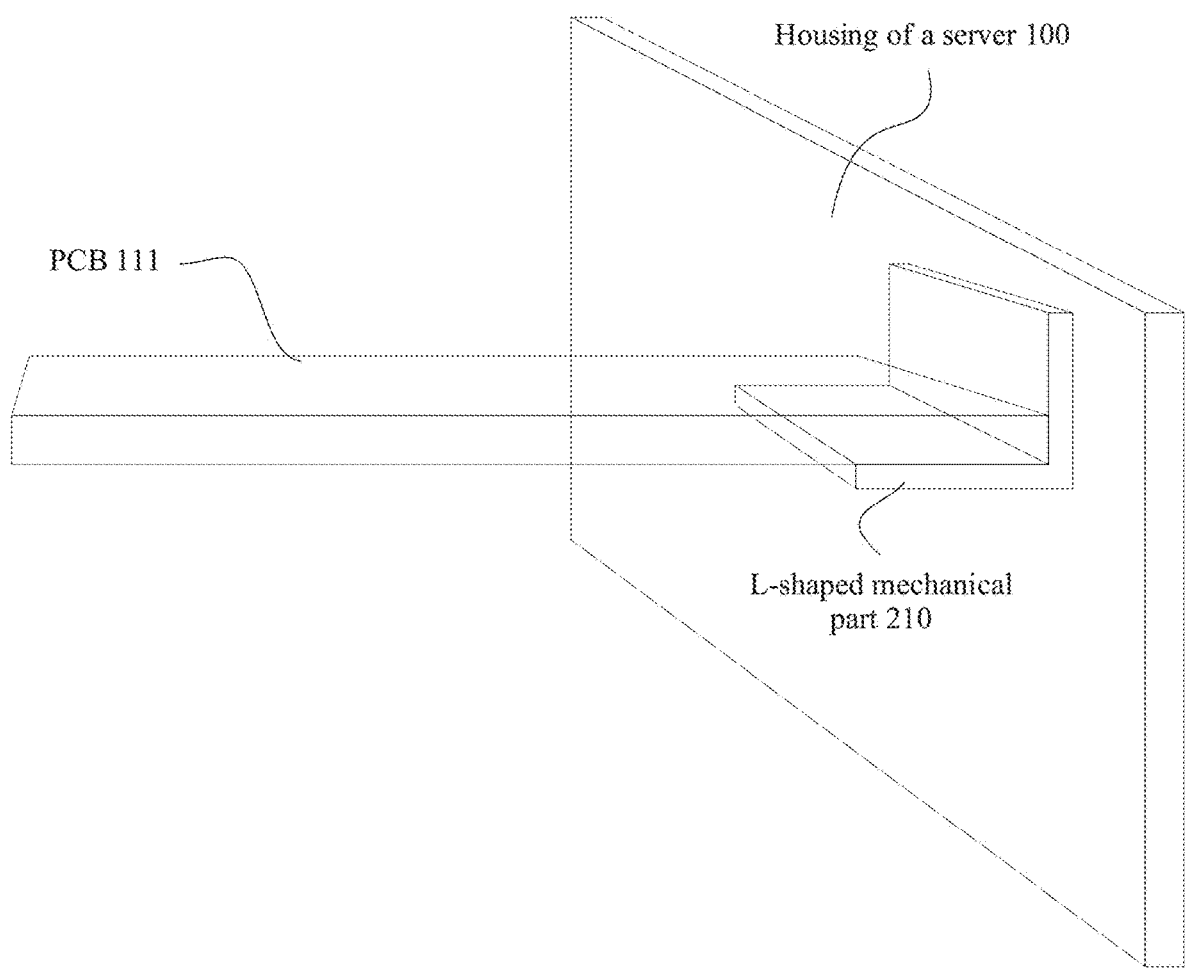
FIG. 4A is a schematic diagram in which a PCB is fixedly connected to a housing of a server.

Herein, only a manner of fastening one of the plurality of PCBs 111 to the housing of the server 100 is used as an example for description. As shown in FIG. 4A, the PCB 111 is fastened to the housing of the server 100 by using an L-shaped mechanical part 210. The PCB 111 and the housing of the server 100 are respectively fastened to two perpendicular surfaces of the L-shaped mechanical part 210. The PCB 111 may be fastened to one surface of the L-shaped mechanical part 210 by using a nut. The housing of the server 100 may also be fastened to the other surface of the L-shaped mechanical part 210 by using a nut.

The shape of the mechanical part 210 shown in FIG. 4A is merely an example. The shape of the mechanical part is not limited in this embodiment. Any mechanical part that can fasten the plurality of PCBs 111 to the housing of the server 100 is applicable to this embodiment.

Figure 4B:
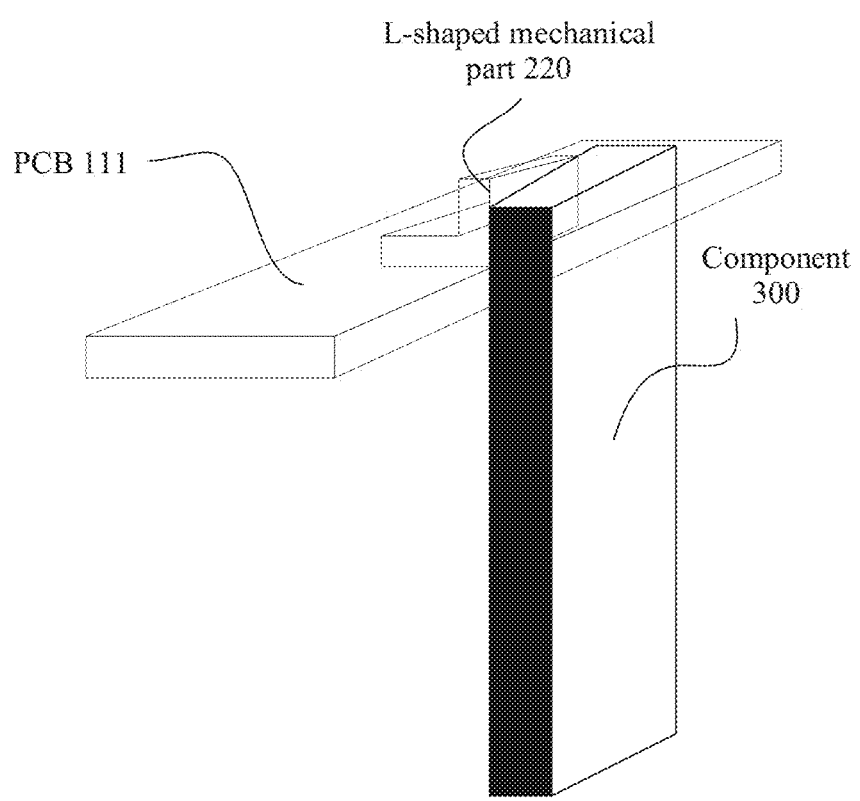
FIG. 4B is a schematic diagram in which a PCB is fixedly connected to a component having a fastening function in a server.

Herein, only a manner of fastening one of the plurality of PCBs 111 to a component 300 having a fastening function in the server 100 is used as an example for description. As shown in FIG. 4B, the component 300 may be a plate-shaped or rod-shaped component that is fastened inside the server 100. The shape of the component 300 herein is merely an example. The shape and a type of the component 300 are not limited in this embodiment. Any component that is inside the server 100 and has a fastening function is applicable to this embodiment.

The PCB 111 is fastened to the component 300 by using an L-shaped mechanical part 220. The PCB 111 and the component 300 are respectively fastened to two perpendicular surfaces of the L-shaped mechanical part 220. The PCB 111 may be fastened to one surface of the L-shaped mechanical part 220 by using a nut. The component 300 may also be fastened to the other surface of the L-shaped mechanical part 220 by using a nut.

Figure 5:
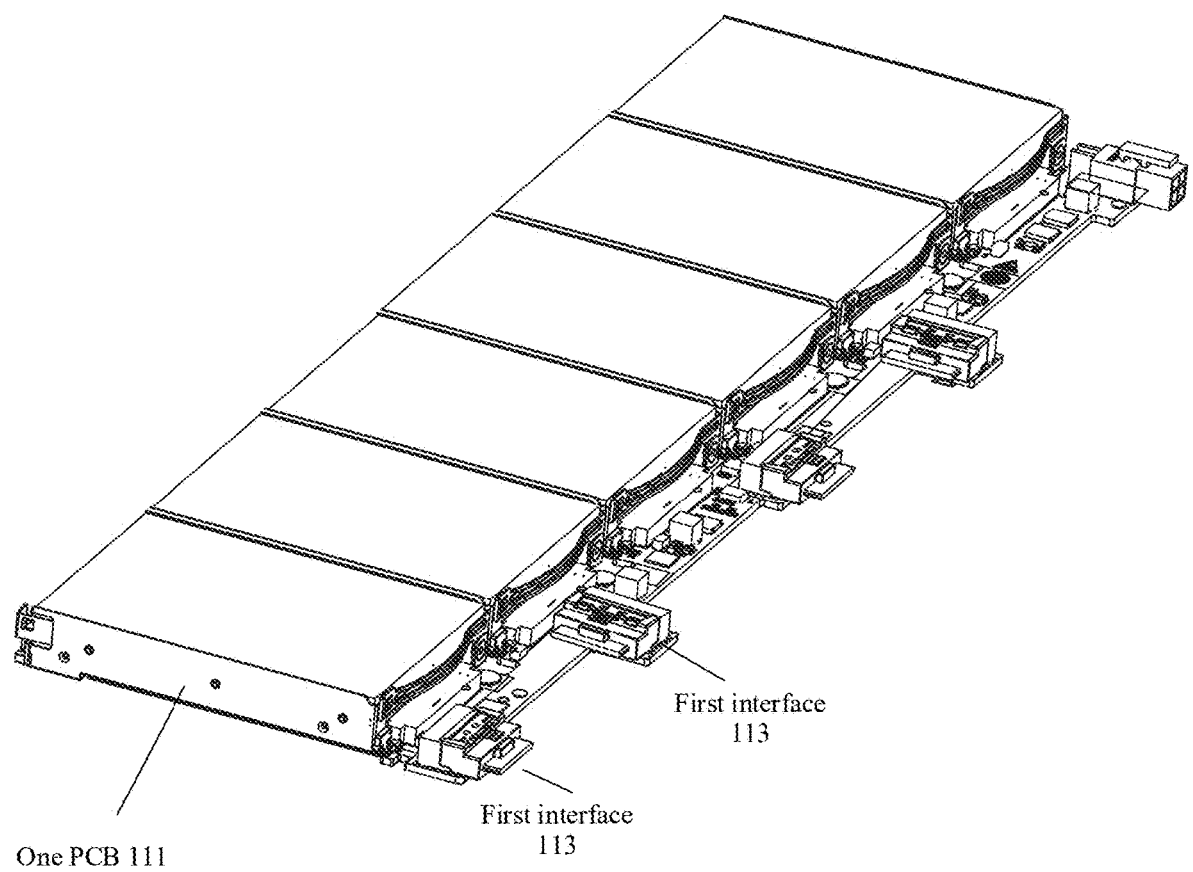
FIG. 5 is a schematic diagram of a structure of a PCB in a hard disk backplane.

The backplane 110 may be connected to a mainboard of the server 100. FIG. 5 is a schematic diagram of a structure of a PCB 111 in the backplane 110. The PCB 111 may include at least two first interfaces 113, and each first interface 113 is connected to the mainboard of the server 100 through a data cable 130.

Figure 6:
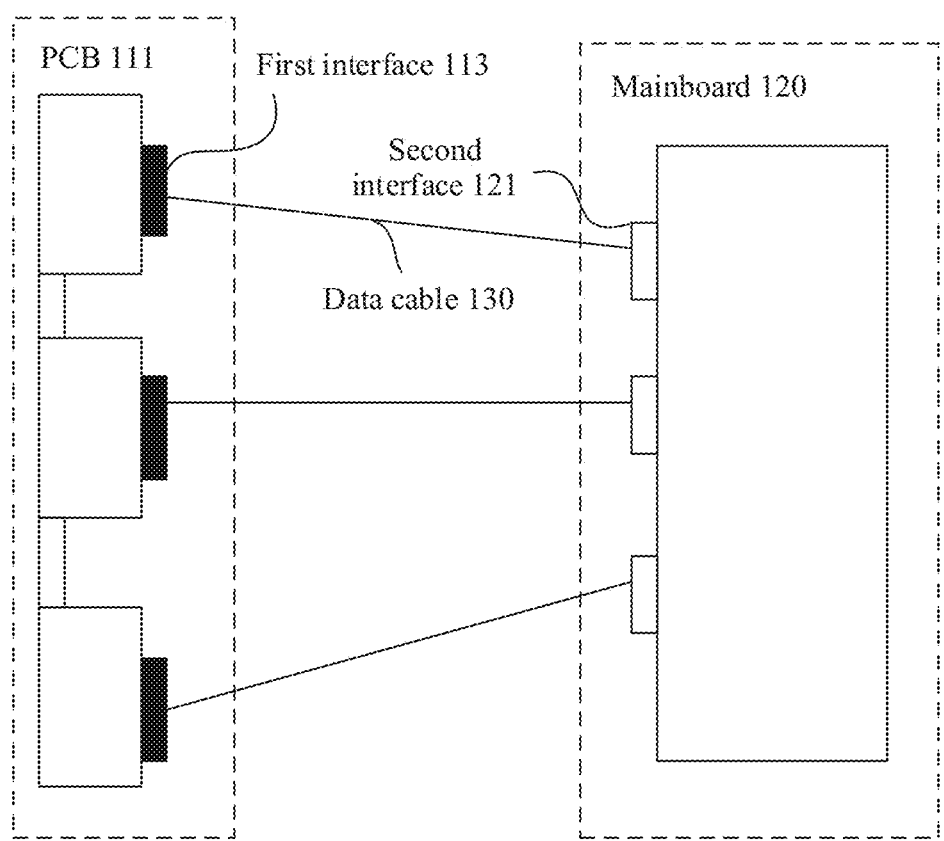
FIG. 6 is a schematic diagram in which a PCB in a hard disk backplane is connected to a mainboard of a server.

As shown in FIG. 6, second interfaces 121 corresponding to the first interfaces 113 of the PCB 111 are also disposed on a mainboard 120 of the server 100. Each first interface 113 may establish a connection to the second interface 121 on the mainboard 120 of the server 100 through a data cable 130.

On a PCB 111, a first interface 113 on the PCB 111 corresponds to some or all of hard disks housed on hard disk slots 112 on the PCB 111. In other words, the first interface 113 is connected to some or all of the hard disks on the PCB 111. The first interface 113 on the PCB 111 is connected to the second interface 121 on the mainboard 120 of the server 100 through the data cable 130, so that the mainboard 120 (for example, a processor on the mainboard 120) of the server 100 may establish a connection to a hard disk corresponding to the first interface 113 on the PCB 111, to perform a read/write operation on the hard disk corresponding to the first interface 113.

Herein, a correspondence between the second interfaces 121 on the mainboard 120 of the server 100 and the first interfaces 113 on the PCB 111 is described. A processor may be disposed on the mainboard 120 of the server 100, and the processor may be connected to the hard disk on the PCB 111 based on the connection between the second interface 121 and the first interface 113, to implement the read/write operation on the hard disk. However, the backplane 110 includes a plurality of PCB 111, and one or more hard disks can be housed in the hard disk slots 112 of each PCB 111. When performing the read/write operation, the processor needs to distinguish the hard disks, to determine a hard disk for reading or writing. The processor may distinguish different hard disks by using different second interfaces 121.

Figure 7A:
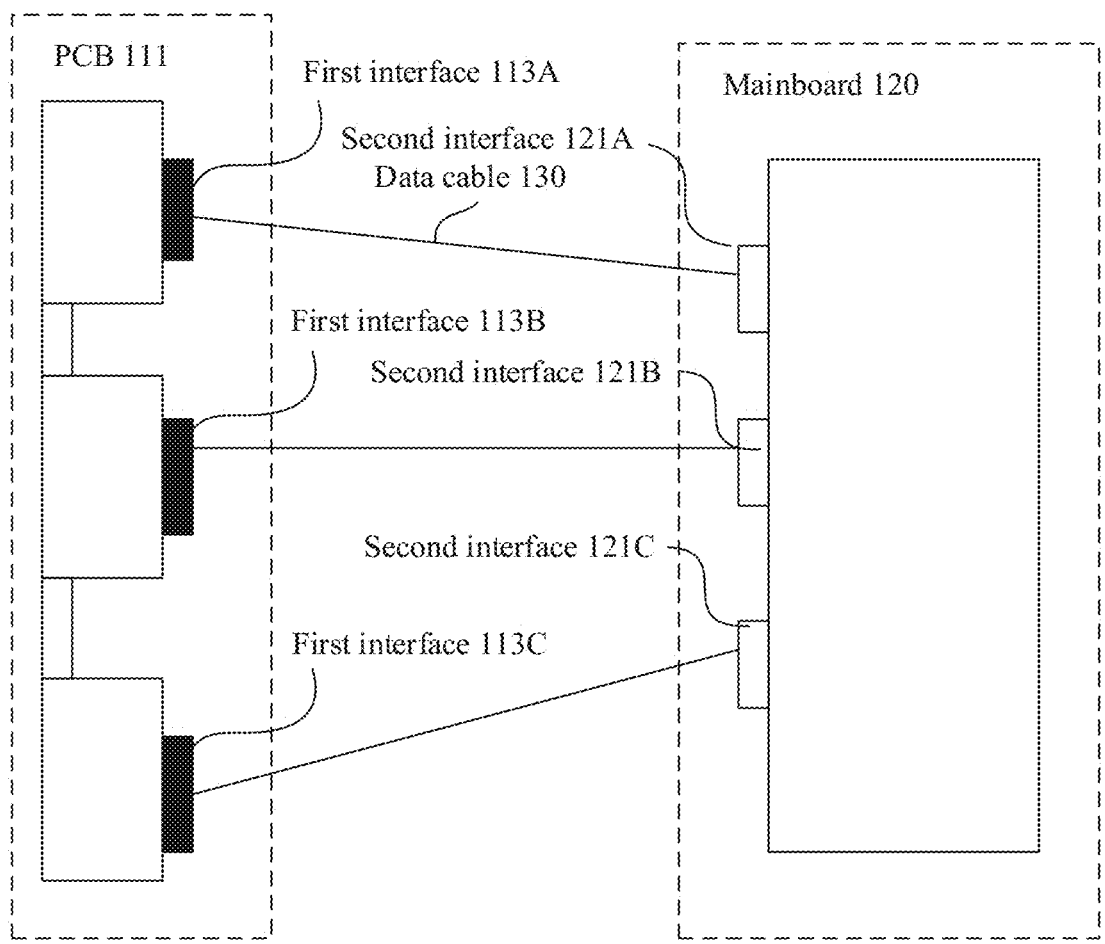
FIG. 7A and FIG. 7B are schematic diagrams in which a first interface in a PCB is connected to a second interface in a mainboard of the server.

For example, as shown in FIG. 7A, the mainboard 120 of the server 100 has a second interface 121A, a second interface 121B, and a second interface 121C, and the PCB 111 has a first interface 113A (corresponding to a hard disk 1 and a hard disk 2 that are housed on the PCB 111), a first interface 113B (corresponding to a hard disk 3 and a hard disk 4 that are housed on the PCB 111), and a first interface 113C (corresponding to a hard disk 5 and a hard disk 6 that are housed on the PCB 111). A correct connection relationship between the second interfaces 121 on the mainboard 120 of the server 100 and the first interfaces 113 on the PCB 111 is as follows: The first interface 113A is connected to the second interface 121A, the first interface 113B is connected to the second interface 121B, and the first interface 113C is connected to the second interface 121C. Herein, the correct connection relationship between the first interfaces 113 and the second interfaces 121 is the correspondence between the first interfaces 113 and the second interfaces 121. The correspondence may be understood as a preset connection relationship. Only when the connection relationship is met, it may be considered that the first interface is correctly connected to the second interface. Otherwise, the first interface is incorrectly connected to the second interface. In this way, after the second interface 121 on the mainboard 120 of the server 100 is connected to the first interface 113 on the PCB 111, the processor determines that hard disks connected through the second interface 121A are the hard disk 1 and the hard disk 2, determines that hard disks connected through the second interface 121B are the hard disk 3 and the hard disk 4, and determines that hard disks connected through the second interface 121C are the hard disk 5 and the hard disk 6.

However, in actual application, to dispose the backplane 110 more flexibly, a hard disk housed on the backplane 110 or one or more PCBs 111 may be replaced based on an actual requirement, a pluggable design is used for the connection between the first interface 113 and the second interface 121. To be specific, the data cable 130 between the first interface 113 and the second interface 121 may be flexibly removed from or inserted into the first interface 113 or the second interface 121.

Figure 7B:
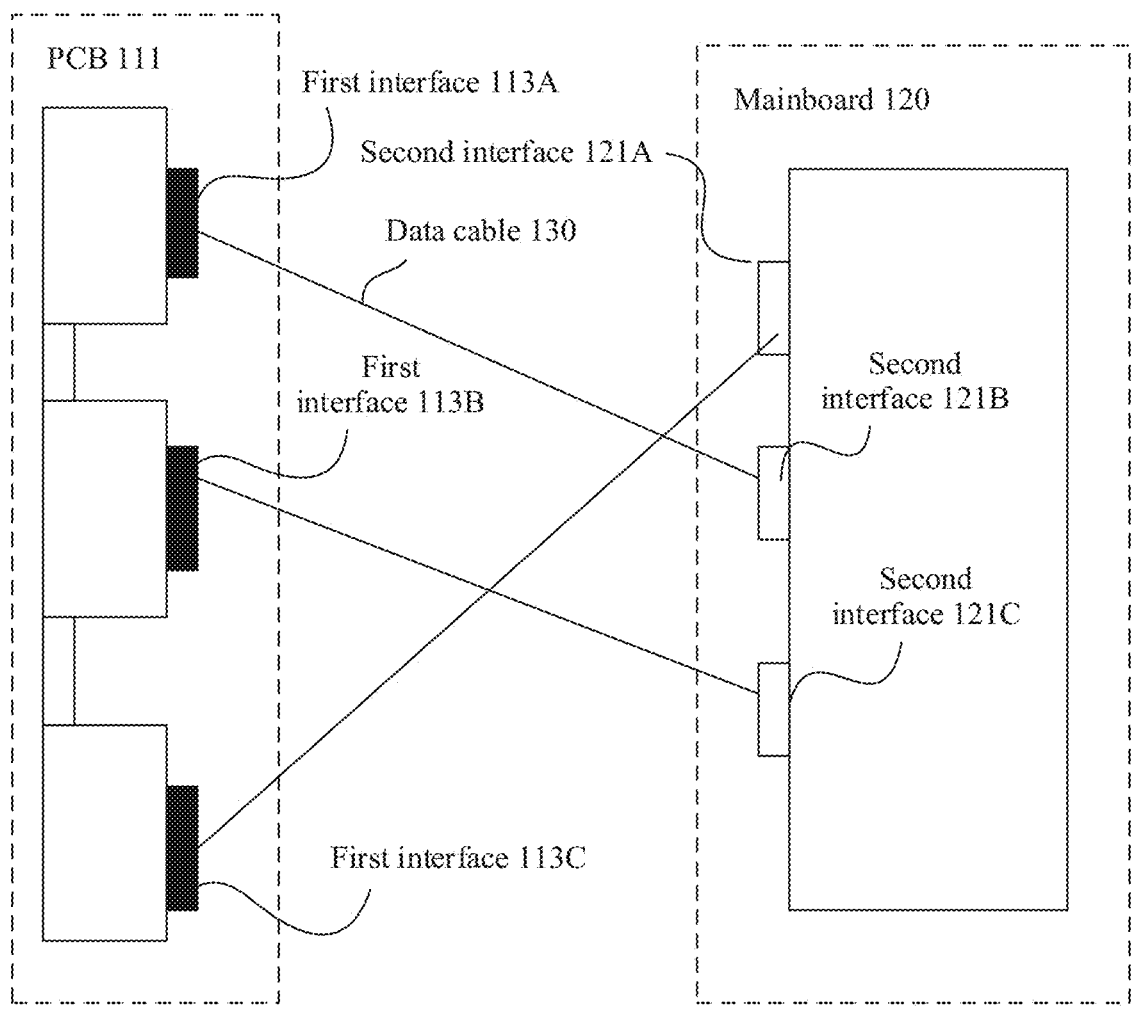

When the pluggable design is used for the connection between the first interface 113 and the second interface 121, there is a case of an incorrect connection between the first interface 113 and the second interface 121. For example, as shown in FIG. 7B, the first interface 113A is connected to the second interface 121B, the first interface 113B is connected to the second interface 121C, and the first interface 113C is connected to the second interface 121A. Due to this incorrect connection, the processor cannot correctly distinguish the hard disks, and the read/write operation performed on the hard disk may be disordered.

To avoid this incorrect connection, the embodiments provide several manners. The following separately describes the several manners.

Manner 1: The first interface 113 and the second interface 121 that need to be connected (that is, the correspondence between the first interfaces 113 and the second interfaces 121) are determined by using a length of the data cable 130.

The data cables 130 between the first interfaces 113 and the second interfaces 121 may be set to different lengths, and the first interfaces 113 on the PCB 111 are connected to the corresponding second interfaces 121 on the mainboard 120 of the server 100 through the data cables 130 of different lengths.

For example, lengths of data cables 130 used for connecting two adjacent first interfaces 113 on the PCB 111 to corresponding second interfaces 121 on the mainboard 120 of the server 100 are different. For another example, lengths of data cables 130 used for connecting any two first interfaces 113 on the PCB 111 to corresponding second interfaces 121 on the mainboard 120 of the server 100 are different.

Figure 8A:
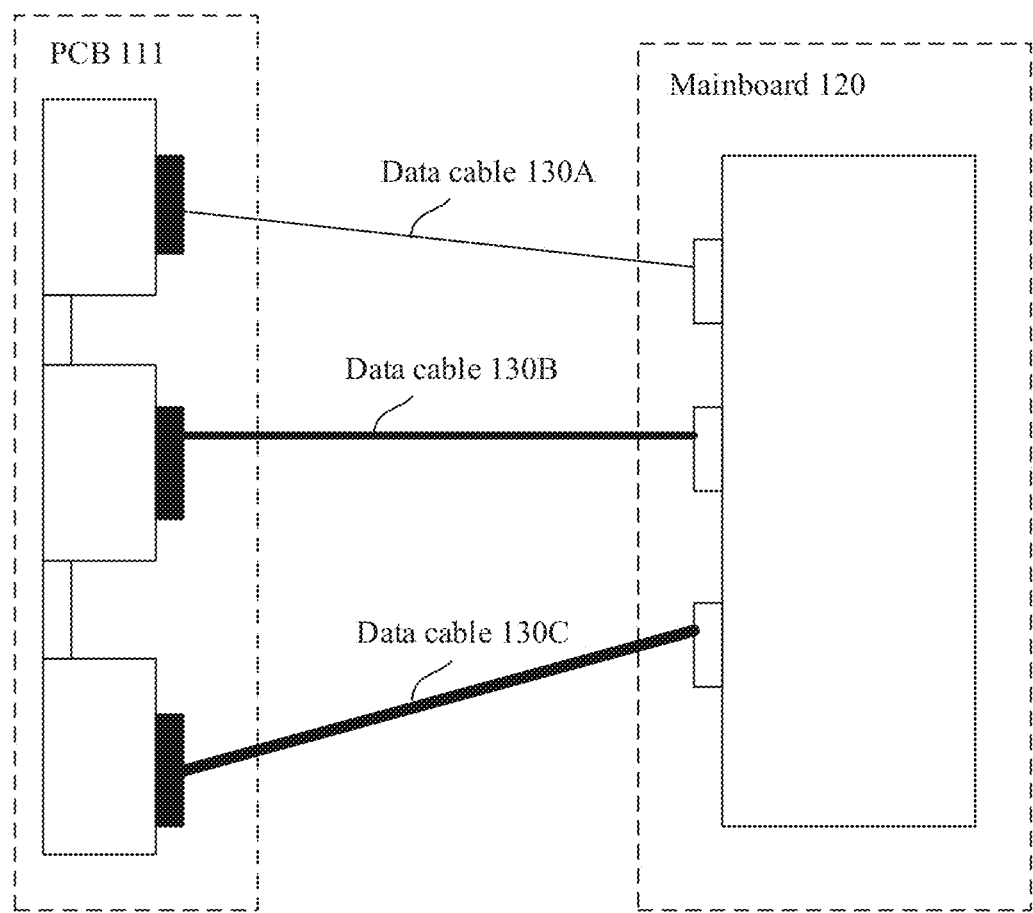
FIG. 8A is a schematic diagram of data cables with different lengths between first interfaces in a PCB and second interfaces in a mainboard of a server.

As shown in FIG. 8A, for example, a data cable 130 between the first interface 113A and the second interface 121A is a data cable 130A, a data cable 130 between the first interface 113B and the second interface 121B is a data cable 130B, and a data cable 130 between the first interface 113C and the second interface 121C is a data cable 130C. The first interface 113A, the first interface 113B, and the first interface 113C are three consecutive first interfaces 113 on the PCB 111. Lengths of the data cable 130A, the data cable 130B, and the data cable 130C may be different from each other. The lengths of the data cable 130A and the data cable 130C may be the same, and the lengths of the data cable 130A and the data cable 130B are different.

Herein, an example in which the first interface 113 and the second interface 121 that need to be connected are determined by using the length of the data cable 130 is used. In actual application, the first interface 113 and the second interface 121 that need to be connected may alternatively be determined in a manner, for example, a color of the data cable 130, sizes or shapes of the first interface 113 and the second interface 121, or orientations of the first interface 113 and the second interface 121.

Manner 2: A management module is disposed. The management module determines, based on a signal on the data cable 130 between the first interface 113 and the second interface 121, whether the first interface 113 is correctly connected to the second interface 121.

Figure 8B:
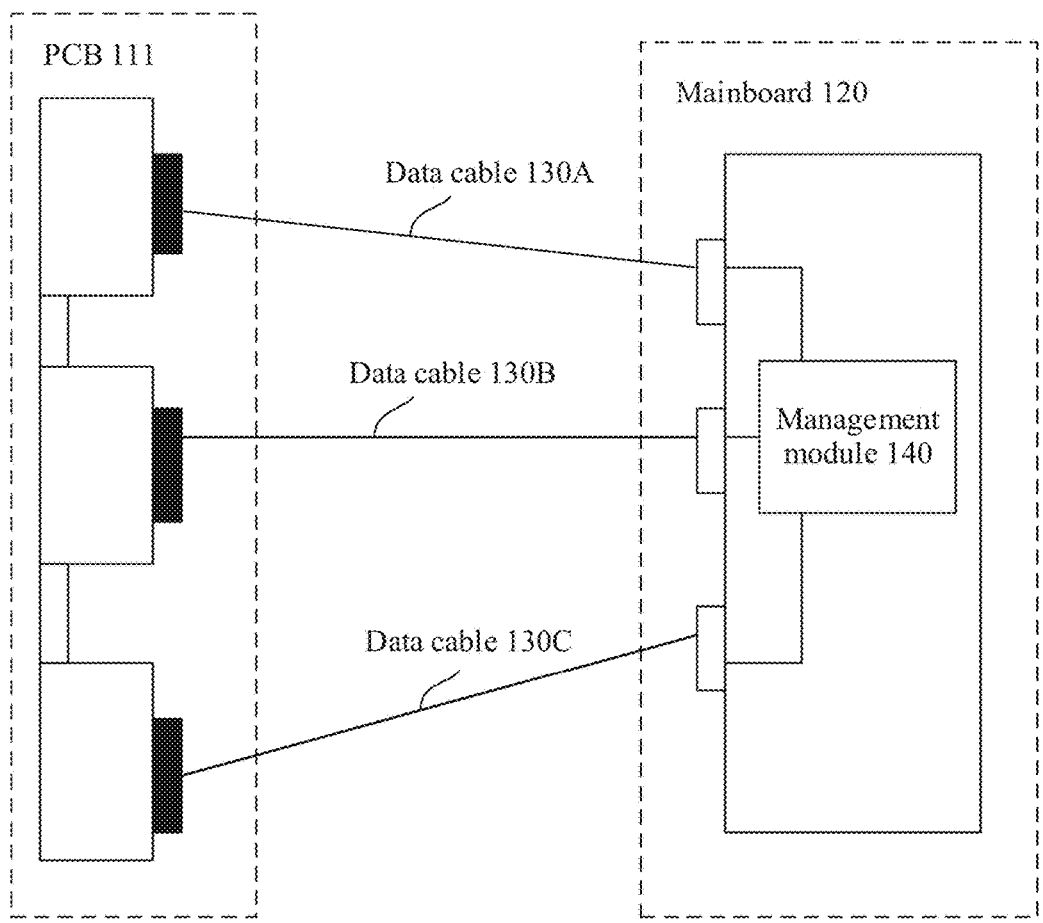
FIG. 8B is a schematic diagram of a disposed position of a management module in a server.

As shown in FIG. 8B, the server 100 may further include a management module 140. The management module 140 may be disposed on the mainboard 120 of the server 100, or may be disposed outside the mainboard 120 of the server 100. The management module 140 may obtain and detect the signal on the data cable 130 between the first interface 113 and the second interface 121.

A manner in which the management module 140 obtains the signal on the data cable 130 between the first interface 113 and the second interface 121 is not limited herein. When the management module 140 is disposed on the mainboard 120 of the server 100, the management module 140 may be connected to the second interface 121, and obtain, from the second interface 121, the signal on the data cable 130 between the first interface 113 and the second interface 121. When the management module 140 is disposed outside the mainboard 120 of the server 100, the management module 140 may be connected to the mainboard 120 of the server 100, and obtain the signal on the data cable 130 between the first interface 113 and the second interface 121 through the mainboard 120 of the server 100.

After obtaining the signal on the data cable 130 between the first interface 113 and the second interface 121, the management module 140 may detect the signal on the data cable 130 between the first interface 113 and the second interface 121, and compare the signal with a preset signal. If the signals are consistent, the management module 140 determines that the first interface 113 is correctly connected to the second interface 121. Otherwise, the management module 140 determines that the first interface 113 is incorrectly connected to the second interface 121.

It should be noted that the data cable 130 between the first interface 113 and the second interface 121 may include a plurality of pins, and each pin may be configured to transmit a signal. The management module 140 may detect signals transmitted on one or more pins in the data cable 130 between the first interface 113 and the second interface 121, and compare the signals transmitted on the one or more pins with the preset signal.

When detecting the signal on the data cable 130 between the first interface 113 and the second interface 121, the management module 140 may detect a signal value of the signal, for example, detect whether the signal is a high-level signal or a low-level signal. For example, the first interface 113A on the PCB 111 may send a high-level signal, and the first interface 113B may send a low-level signal. If a signal obtained by the management module 140 through the second interface 121A is a high-level signal, and a signal obtained by the management module 140 through the second interface 121B is a low-level signal, the management module 140 determines that the first interface 113A is correctly connected to the second interface 121A, and that the first interface 113B is correctly connected to the second interface 121B. If a signal obtained by the management module 140 through the second interface 121A is a low-level signal, and a signal obtained by the management module 140 through the second interface 121B is a high-level signal, the management module 140 determines that the first interface 113A is incorrectly connected to the second interface 121A, and that the first interface 113B is incorrectly connected to the second interface 121B.

When detecting the signal on the data cable 130 between the first interface 113 and the second interface 121, the management module 140 may alternatively detect a duty cycle of the signal, where the duty cycle may refer to a proportion of a high-level signal or a low-level signal in a signal period; and determine whether the duty cycle of the signal is a preset value. For example, the first interface 113A on the PCB 111 may send a signal whose duty cycle is 85%, and the first interface 113B may send a signal whose duty cycle is 15%. If a signal obtained by the management module 140 through the second interface 121A is a signal whose duty cycle is 85%, and a signal obtained by the management module 140 through the second interface 121B is a signal whose duty cycle is 15%, the management module 140 determines that the first interface 113A is correctly connected to the second interface 121A, and that the first interface 113B is correctly connected to the second interface 121B. If a signal obtained by the management module 140 through the second interface 121A is a signal whose duty cycle is 100%, and a signal obtained by the management module 140 through the second interface 121B is a signal whose duty cycle is 100%, the management module 140 determines that the first interface 113A is incorrectly connected to the second interface 121A, and that the first interface 113B is incorrectly connected to the second interface 121B.

A manner of generating the signal sent by the first interface 113 on the PCB 111 is not limited in this embodiment. For example, a component that can generate the signal is disposed on the PCB, and the component is connected to the first interface 113 on the PCB, so that the generated signal is sent through the first interface. For another example, the PCB 111 may be connected to a component that is disposed outside the backplane 110 and that is configured to generate the signal, and the component sends the generated signal through the first interface.

A composition of the management module 140 is not limited in this embodiment. For example, the management module 140 may be a central processing unit, an ASIC, a field-programmable gate array (FPGA), a complex programmable logic device (CPLD), or a module including some or all of the foregoing compositions. The management module may be an added module in the server 100 or an existing management module 140 in the server 100, for example, a baseboard management controller (BMC). To be specific, a function of detecting the signal on the data cable 130 between the first interface 113 and the second interface 121 is added to the existing management module 140 in the server 100.

When determining that the first interface 113 is incorrectly connected to the second interface 121, the management module 140 may give an alarm. A manner in which the management module 140 gives the alarm is not limited in this embodiment. For example, the alarm may be given by using a warning sound, the alarm may be given by using a caution light, or the alarm may be given by using both a warning sound and a caution light.

A manner of connecting the first interface 113 to the second interface 121 is not limited in this embodiment. For example, the first interface 113 on the backplane 110 may be directly connected to the second interface 121 on the mainboard 120 of the server 100 through the data cable 130, or may be connected to the second interface 121 on the mainboard 120 of the server 100 through an expansion board. The following separately describes the two manners.

Manner 1: The first interface 113 on the backplane 110 is directly connected to the second interface 121 on the mainboard 120 of the server 100 through the data cable 130.

Figure 9A:
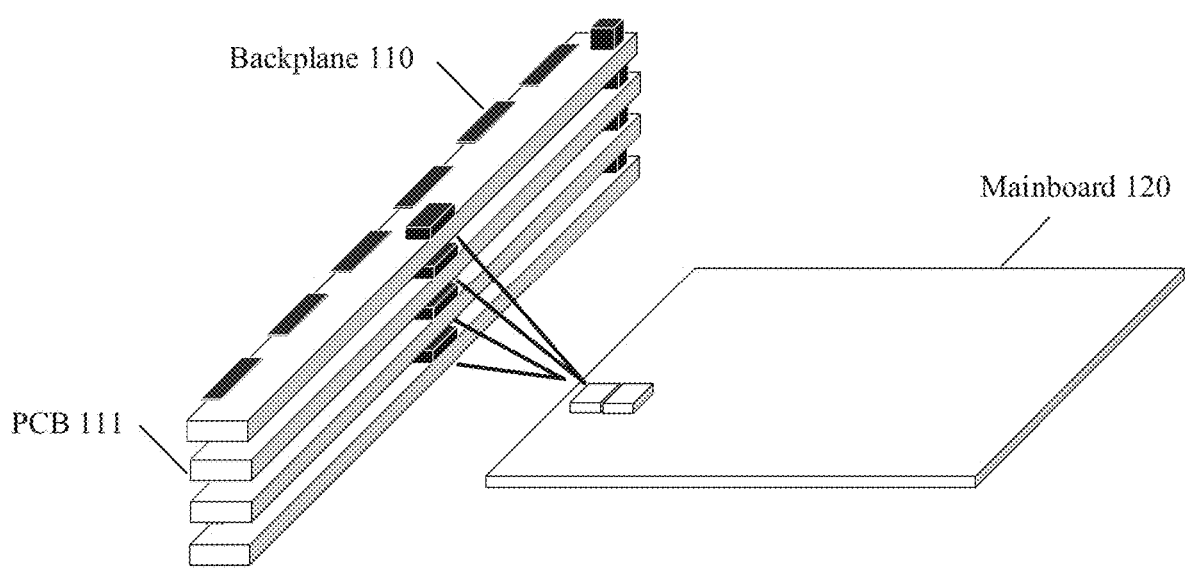
FIG. 9A to FIG. 9C are schematic diagrams in which a backplane is connected to a mainboard of a server.

A PCB 111 in the backplane 110 is used as an example. As shown in FIG. 9A, the PCB 111 is directly connected to the mainboard 120 of the server 100. To be specific, a plurality of first interfaces 113 on the PCB 111 are respectively connected to a plurality of second interfaces 121 on the mainboard 120 of the server 100 through data cables 130, and the first interfaces 113 are connected to the second interfaces 121 one to one.

Manner 2: The first interface 113 on the backplane 110 is connected to the second interface 121 on the mainboard 120 of the server 100 through the expansion board.

Usually, a quantity of second interfaces 121 on the mainboard 120 of the server 100 is limited, and it cannot be ensured that each first interface 113 on the backplane 110 can be connected to one second interface 121 on the mainboard 120 of the server 100. To ensure that each first interface 113 on the backplane 110 can be connected to the mainboard 120 of the server 100, an expansion board 150 may be added between the backplane 110 and the mainboard 120 of the server 100. The expansion board 150 may be a Serial Attached SCSI (SAS) expander or a Peripheral Component Interconnect Express (PCIe) switch. A type of the expansion board 150 is not limited in this embodiment.

The first interface 113 on the PCB 111 may be first connected to the expansion board 150, and the expansion board 150 is connected to the second interface 121 on the mainboard 120 of the server 100, to implement interface expansion.

The expansion board 150 may be parallel to the air inflow direction of the air intake vent, to reduce obstruction to air flowing into the server 100.

Figure 9B:
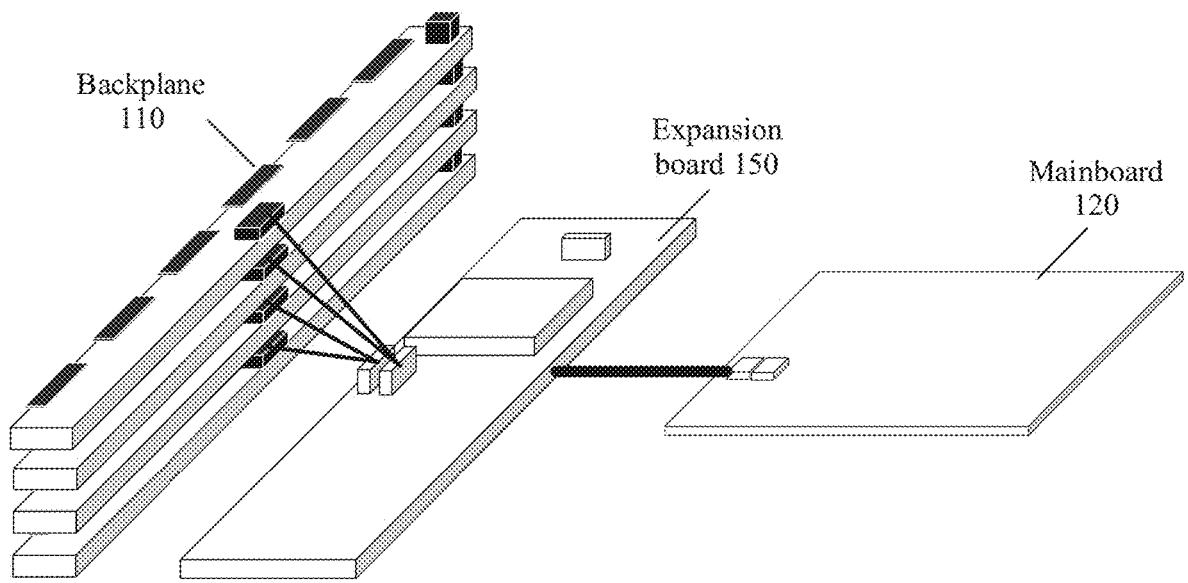

FIG. 9B is a schematic diagram of a structure of the backplane 110 and the expansion board 150. The expansion board 150 may be parallel to the air inflow direction of the air intake vent, and the expansion board 150 is parallel to the backplane 110.

Similarly, to prevent the first interface 113 from being incorrectly connected to the expansion board 150, the data cables 130 that need to be connected to different first interfaces 113 may also be distinguished by using the lengths of the data cables 130, the different first interfaces 113 may be distinguished by using the shapes of the first interfaces 113, or the management module 140 may determine whether the first interface 113 is correctly connected to the second interface 121 (in this case, it may be understood that whether the first interface 113 is correctly connected to the expansion board 150 is detected). For a specific manner, refer to the foregoing content. Details are not described herein again.

Figure 9C:
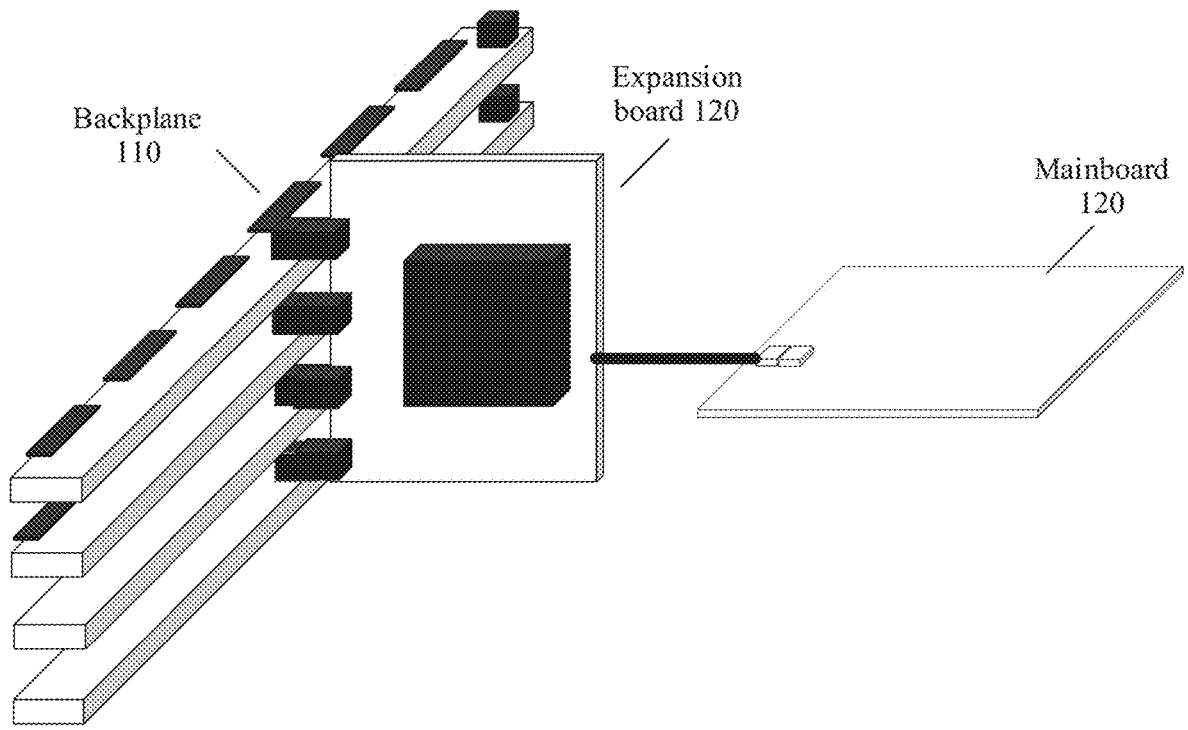

FIG. 9C is a schematic diagram of a structure of the backplane 110 and the expansion board 150. The expansion board 150 may be parallel to the air inflow direction of the air intake vent, and the expansion board 150 is perpendicular to the backplane 110.

Similarly, to prevent the first interface 113 from being incorrectly connected to the expansion board 150, the data cables 130 that need to be connected to first interfaces 113 may also be distinguished by using the lengths of the data cables 130, the different first interfaces 113 may be distinguished by using the shapes of the first interfaces 113, or the management module 140 may determine whether the first interface 113 is correctly connected to the second interface 121 (in this case, it may be understood that whether the first interface 113 is correctly connected to the expansion board 150 is detected). For a specific manner, refer to the foregoing content. Details are not described herein again.

It is clear that a person skilled in the art can make various modifications and variations without departing from the scope of this disclosure. In this way, this disclosure is intended to cover these modifications and variations provided that they fall within the scope of the claims and equivalent technologies thereof.

What is claimed is:

1. A server comprising:
 a hard disk;
 an air intake vent configured to inflow air in an air inflow direction;
 an air exhaust vent configured to outflow air in an air outflow direction
 a mainboard comprising second interfaces;
 a backplane located between the air intake vent and the air exhaust vent, extending lengthwise in a first direction parallel to the air inflow direction or the air outflow direction, extending widthwise in a second direction that is orthogonal to the first direction and is from the hard disk to the mainboard, extending heightwise in a third direction orthogonal to the first direction and the second direction, configured to house the hard disk in the first direction, and comprising:
  printed circuit boards (PCBs) disposed in parallel and distributed to create spacings that are between adjacent PCBs of the PCBs and that extend in the third direction; and
  first interfaces;
 data cables connecting the first interfaces to the second interfaces, wherein lengths of the data cables connecting adjacent first interfaces to corresponding second interfaces are different; and
 an expansion board positioned parallel to the air inflow direction or the air outflow direction, connected to the first interfaces through the data cables, and connected to the second interfaces through the data cables.

2. The server of claim 1, wherein the first direction is parallel to the air inflow direction.

3. The server of claim 1, wherein each of the PCBs comprises a hard disk slot.

4. The server of claim 3, wherein the PCBs are distributed on a plurality of planes that are parallel to the air inflow direction or the air outflow direction.

5. The server of claim 4, further comprising:
 a housing; and
 a mechanical part fastening the PCBs to the housing.

6. The server of claim 1, further comprising a management module connected to the second interfaces and configured to:
 detect whether the first interfaces are correctly connected to the second interfaces; and
 give an alarm when the first interfaces are not correctly connected to the second interfaces.

7. The server of claim 6, wherein the management module is further configured to detect whether the first interfaces are correctly connected to the second interfaces by:
 obtaining signals on the data cables between the first interfaces and the second interfaces; and
 determining, based on the signals, whether the first interfaces are correctly connected to the second interfaces.

8. A cabinet server comprising:
 a server comprising:
  a hard disk;
  an air intake vent configured to inflow air in an air inflow direction;
  an air exhaust vent configured to outflow air in an air outflow direction
  a mainboard comprising second interfaces;
  a backplane located between the air intake vent and the air exhaust vent, extending lengthwise in a first direction parallel to the air inflow direction or the air outflow direction, extending widthwise in a second direction that is orthogonal to the first direction and is from the hard disk to the mainboard, extending heightwise in a third direction orthogonal to the first direction and the second direction, configured to house the hard disk in the first direction, and comprising:
   printed circuit boards (PCBs) disposed in parallel and distributed to create spacings that are between adjacent PCBs of the PCBs and that extend in in the third direction; and
   first interfaces;
  data cables connecting the first interfaces to the second interfaces, wherein lengths of the data cables connecting adjacent first interfaces to corresponding second interfaces are different; and
  an expansion board positioned parallel to the air inflow direction or the air outflow direction, connected to the first interfaces through the data cables, and connected to the second interfaces through the data cables.

9. The cabinet server of claim 8, wherein the first direction is parallel to the air inflow direction.

10. The cabinet server of claim 8, wherein each of the PCBs comprises a hard disk slot.

11. The cabinet server of claim 10, wherein the PCBs are distributed on a plurality of planes that are parallel to the air inflow direction or the air outflow direction.

12. The cabinet server of claim 11, wherein the server further comprises:
 a housing; and
 a mechanical part fastening the PCBs to the housing.

13. A blade server comprising:
 a server comprising:
  a hard disk;
  an air intake vent configured to inflow air in an air inflow direction;
  an air exhaust vent configured to outflow air in an air outflow direction
  a mainboard comprising second interfaces;
  a backplane located between the air intake vent and the air exhaust vent, extending lengthwise in a first direction parallel to the air inflow direction or the air outflow direction, extending widthwise in a second direction that is orthogonal to the first direction and is from the hard disk to the mainboard, extending heightwise in a third direction orthogonal to the first direction and the second direction, configured to house the hard disk in the first direction, and comprising:
   printed circuit boards (PCBs) disposed in parallel and distributed to create spacings that are between adjacent PCBs of the PCBs and that extend in the third direction; and
   first interfaces;
  data cables connecting the first interfaces to the second interfaces, wherein lengths of the data cables connecting adjacent first interfaces to corresponding second interfaces are different; and
  an expansion board positioned parallel to the air inflow direction or the air outflow direction, connected to the first interfaces through the data cables, and connected to the second interfaces through the data cables.

14. The blade server of claim 13, wherein the first direction is parallel to the air inflow direction.

15. The cabinet server of claim 8, wherein the server further comprises a management module connected to the second interfaces and configured to:

detect whether the first interfaces are correctly connected to the second interfaces; and give an alarm when the first interfaces are not correctly connected to the second interfaces.

16. The cabinet server of claim 15, wherein the management module is further configured to detect whether the first interfaces are correctly connected to the second interfaces by:

obtaining signals on the data cables between the first interfaces and the second interfaces; and determine, based on the signals, whether the first interfaces are correctly connected to the second interfaces.

17. The blade server of claim 13, wherein each of the PCBs comprises a hard disk slot.

18. The blade server of claim 17, wherein the PCBs are distributed on a plurality of planes that are parallel to the air inflow direction or the air outflow direction.

19. The blade server of claim 18, wherein the server further comprises:

a housing; and a mechanical part fastening the PCBs to the housing.

20. The blade server of claim 13, wherein the server further comprises a management module connected to the second interfaces and configured to:

detect whether the first interfaces are correctly connected to the second interfaces by:

obtaining signals on the data cables between the first interfaces and the second interfaces; and determining, based on the signals, whether the first interfaces are correctly connected to the second interfaces; and give an alarm when the first interfaces are not correctly connected to the second interfaces.

* * * * *